United States Patent [19]

Jain et al.

[11] Patent Number: 5,114,695

[45] Date of Patent: May 19, 1992

[54] PROCESS OF PRODUCING ALUMINUM AND TITANIUM NITRIDES

[75] Inventors: Mukesh K. Jain; Sadashiv K. Nadkarni, both of Jonquiere; Adam Gesing, Kingston, all of Canada

[73] Assignee: Alcan International Limited, Montreal, Canada

[21] Appl. No.: 179,214

[22] Filed: Apr. 7, 1988

[30] Foreign Application Priority Data

Apr. 14, 1987 [CA] Canada .................................. 534707

[51] Int. Cl.⁵ .................... C01B 21/076; C01B 21/072
[52] U.S. Cl. .................................. 423/411; 423/412; 501/96
[58] Field of Search ...................... 423/412, 411, 406; 501/96; 521/64, 92

[56] References Cited

U.S. PATENT DOCUMENTS

| | | | |
|---|---|---|---|
| 1,344,153 | 6/1920 | Shoeld | ................................. 423/412 |
| 2,797,201 | 6/1957 | Veatch et al. | |
| 2,799,912 | 7/1957 | Greger | ................................. 423/440 |
| 3,312,632 | 4/1967 | Smith | |

(List continued on next page.)

FOREIGN PATENT DOCUMENTS

| | | | |
|---|---|---|---|
| 1034331 | 4/1982 | Canada . | |
| 1027297 | 11/1985 | Canada . | |
| 0271353 | 6/1988 | European Pat. Off. | |
| 1076099 | 5/1957 | Fed. Rep. of Germany | ...... 423/412 |
| 1188046 | 9/1959 | Fed. Rep. of Germany | ...... 423/412 |
| 2353090 A | 11/1980 | Fed. Rep. of Germany . | |
| 2413930 A | 5/1981 | Fed. Rep. of Germany . | |
| 2136288 | 3/1983 | Fed. Rep. of Germany . | |
| 2136288 A | 4/1986 | Fed. Rep. of Germany . | |
| 51-104495 A | 4/1976 | Japan . | |
| 55-159946 | 2/1980 | Japan | ................................. 423/406 |
| 5492629 | 2/1981 | Japan . | |
| 17910 | 7/1981 | Japan . | |
| 8117910 | 10/1984 | Japan . | |
| 60-176910 | 3/1985 | Japan | ................................. 423/412 |
| 52103408 | 3/1985 | Japan . | |
| 54125200 | 5/1985 | Japan . | |
| 52150416 | 7/1985 | Japan . | |
| 61-155210 | 7/1986 | Japan | ................................. 423/412 |
| 51104495 A | 8/1986 | Japan . | |
| 8000426 | 5/1981 | PCT Int'l Appl. . | |
| 1457013 | 12/1976 | United Kingdom . | |
| 2162504 A | 7/1981 | United Kingdom . | |

OTHER PUBLICATIONS

Hoch et al., "Preparation and Characterization of Ultrafine Powders of Refractory Nitrides; 1, AlN and $Si_3N_4$", Am. Ceram. Soc. Bull. (USA), vol. 58, No. 2, (1979), pp. 187–190.

Iwama et al., "Ultrafine Powders of TiN and AlN Produced by a Reactive Gas Evaporation Technique with Electron Beam Heating", Journal of Crystal Growth 56 (1982), 265–269, North-Holland Publishing Company.

Houtz, Textile Research Journal, Nov. 1950, pp. 786–801.

Kool et al., J. Vac. Sci. Technol., 1981, 18(3) 1233 7.

Oak Ridge National Laboratory-Carbothermal Synthesis of Silicon Carbide Janney, et al.–May 1985.

Synthesis of Sinterable SiC Powders by Carbothermic Reduction of Gel-Derived Precursors and Pyrolysis of Polycarbosilane–Wei, et al.–vol. 63, No. 8 (1984)..

"Orlon" Arcylic Fiber: Chemistry and Properties–R. C. Houtz, Textile Research Jornal, Nov. 1950.

Japanese Patent Publication 1981-17910 to Toray Industries Inc.

Primary Examiner—Wayne A. Langel
Attorney, Agent, or Firm—Cooper & Dunham

[57] ABSTRACT

A process of producing nitrides of aluminum and titanium. The process involves producing a uniform dispersion of microfine particles of the corresponding metal oxide in an infusible polymer, carbonizing the resulting dispersion in a non-oxidizing atmosphere and heating the carbonized product in a nitrogen atmosphere at high temperature to cause the oxide to react with the carbon and nitrogen to form the nitride. Before carbonization, however, the dispersion is formed into shapes in which none of the oxide particles is more than about 2.5 mm (0.098 inch) from an external surface and the shapes are loosely packed in a reactor. The process can achieve a good conversion of the oxide to the nitride to yield a product of high purity and small particle size.

12 Claims, 7 Drawing Sheets

U.S PATENT DOCUMENTS

| | | |
|---|---|---|
| 3,403,008 | 4/1969 | Hamling . |
| 3,432,594 | 1/1969 | Gortsema .............................. 501/87 |
| 3,436,179 | 4/1969 | Matsuo et al. ...................... 423/412 |
| 3,607,169 | 9/1971 | Coxe . |
| 3,927,181 | 12/1975 | Niimi . |
| 3,937,775 | 2/1976 | Horikiri et al. . |
| 3,947,550 | 3/1976 | Fritchmun . |
| 3,975,194 | 8/1976 | Farnand et al. . |
| 4,009,232 | 2/1977 | Shiiki . |
| 4,126,652 | 10/1978 | Oohara et al. ...................... 423/440 |
| 4,133,854 | 1/1979 | Hendricks . |
| 4,190,439 | 2/1980 | Gortsema ........................... 423/439 |
| 4,256,676 | 3/1981 | Kovach ......................... 264/29.1 X |
| 4,284,612 | 8/1981 | Horne et al. ........................ 423/345 |
| 4,303,729 | 12/1981 | Torobin . |
| 4,349,456 | 9/1982 | Sowman . |
| 4,410,502 | 12/1983 | Yamaguchi et al. . |
| 4,444,894 | 4/1984 | Shaver . |
| 4,460,697 | 6/1984 | Hara et al. . |
| 4,515,763 | 3/1985 | Boudart et al. . |
| 4,529,575 | 5/1985 | Enomoto et al. . |
| 4,615,863 | 10/1986 | Inoue et al. ........................ 501/96 X |
| 4,618,592 | 10/1986 | Kuramoto et al. ................. 423/412 |
| 4,652,436 | 3/1987 | Kato ..................................... 423/412 |
| 4,780,299 | 10/1988 | Kumagor et al. .................... 423/412 |
| 4,784,439 | 11/1988 | Bachelard et al. ............. 423/412 X |
| 4,845,059 | 7/1989 | Kohtoka et al. ...................... 501/98 |
| 4,851,205 | 7/1989 | Mitomo ............................ 501/18 X |
| 4,857,246 | 8/1989 | Bolt ..................................... 264/29.2 |

PROCESS OF PRODUCING ALUMINUM AND TITANIUM NITRIDES

BACKGROUND OF THE INVENTION

I. Field of the Invention

This invention relates to a process for producing nitrides of aluminum and titanium.

II. Description of the Prior Art

Aluminum and titanium nitrides are used in industry for a variety of purposes. For example, titanium nitride is used to coat metallic components, e.g. cutting tools, to improve their wear resistance, and aluminum nitride is currently being developed as an alternative to alumina in the formation of ceramic substrates for the electronics industry.

The most common method of forming metal nitrides is to react the corresponding metal with nitrogen. This method, however, requires the use of fine metal powders, which are very expensive, and it is not easy to control the particle size distribution of the product. Another method of forming nitrides is to react the corresponding metal oxide with carbon at high temperature in an atmosphere containing nitrogen. The main problem with such reactions is that a large proportion of the metal oxide and carbon often remain unreacted in the desired nitride product and are difficult to remove. This problem can be reduced if the oxide and carbon are finely ground and intimately mixed before the reaction is commenced, but at the reaction temperatures employed (usually 1300°-2000° C.), adjacent oxide particles may fuse together trapping carbon particles and making complete reaction quite difficult. Thus, the use of fine particles and intimate mixing cannot entirely overcome the problem of incomplete reaction of the starting materials.

Published Japanese patent application No. 1985-176910 filed in the name of Tokuyama Soda KK and laid open on Sep. 11, 1985 discloses a process for producing aluminum nitride powder in which alumina powder is mixed with a solution of an organic compound, such as polyvinyl alcohol, sucrose, starch etc., the solution is dried and the product heated to carbonize the organic compound, additional carbon is added and the resulting mixture is heated to high temperature under a nitrogen or ammonia atmosphere. While this process is claimed to produce finely divided AlN, attempts to duplicate this process have failed to produce a product of high purity. The particles are also reported to be significantly higher than 1 $\mu$ in size, whereas submicron powders are more preferable for ease of sintering and to obtain theoretical densities.

Published Japanese patent application No. 1980-15946 filed in the name of Toray Industries Co. and laid open for inspection on Feb. 4, 1980 discloses a method of forming a variety of metal nitrides, including AlN and TiN, from the corresponding oxides. In this process, a fine powder of the metal oxide is added to a solution of a carbohydrate, the solution is heated to dry it and to carbonize the carbohydrate, and the product is heated in a nitrogen-containing atmosphere. This process is similar to the one described above and does not yield the stated pure, finely divided product.

Accordingly, an object of the present invention is to provide a process for producing aluminum and titanium nitrides from the corresponding metal oxides which can result in a highly pure nitride product.

Another object of the invention is to provide such a process in which the size and shape of the resulting nitride particles can be controlled to some extent.

SUMMARY OF THE INVENTION

The invention provides a process for producing a nitride of a metal selected from the group consisting of aluminum and titanium by reactions of the corresponding metal oxide with carbon at high temperature in the presence of nitrogen, wherein the process comprises: forming a uniform dispersion of microfine particles of said oxide in a polymer having the following characteristics: (a) a molecular weight of at least 10,000 and a long chain structure of at least 200 monomer units, (b) a carbon yield of at least 30% by weight, and (c) a chemical structure which is infusible or which is capable of being rendered infusible, said dispersion being such that said particles are substantially unagglomerated and separated from each other by said polymer; forming the dispersion into shapes in which substantially none of the oxide particles is more than about 2.5 mm from an external surface; loosely packing said shapes into a reactor; carbonizing the resulting shapes in said reactor in a non-oxidizing atmosphere in order to convert the polymer to carbon; and heating the carbonized product in said reactor at high temperature in a non-oxidizing atmosphere containing nitrogen or a compound which decomposes to form nitrogen at said high temperatures in order to form said nitride.

In the following disclosure, when describing the starting material or the nitride product, the terms "powder" and "whiskers" are employed. The term "powder" is intended to represent a collection of generally non-elongated (equiaxed) particles, whereas the term "whiskers" represents thin, elongated particles. The powder particles need not be spherical and may be irregular, slightly elongated, or in the form of platelets and the whiskers generally have an average aspect ratio of greater than 10, although this is not essential. The powders or whiskers are often described in the following as "microfine". This means that the powders have an average particle size of less than about 5 microns (preferably less than one micron) and the whiskers generally have a diameter of less than 5 microns (preferably less than one micron).

The invention, at least in its preferred forms, is capable of producing microfine nitride powders or whiskers of high purity at relatively low cost, and the basic process outlined above can be modified in ways which will be explained later to favour either the production of a powder or of whiskers.

DETAILED DESCRIPTION OF THE INVENTION

The overall reaction between an aluminum or titanium oxide particle and carbon and nitrogen (or a compound which decomposes to nitrogen under the reaction conditions e.g. ammonia) can be written as follows using $Al_2O_3$ as an example:

$$Al_2O_3 + 3C + N_2 \rightarrow 2 AlN + 3 CO \uparrow$$

However, the inventors of the present invention have determined that the reaction passes through two steps, as follows:

$$Al_2O_3 + C \rightarrow Al_2O_2 + CO \uparrow \quad (1)$$

$$Al_2O_2 + N_2 + 2C \rightarrow 2\ AlN + 2CO \uparrow \qquad (2)$$

Although by conventional reasoning reaction (1) is thermodynamically not feasible, the inventors have established that in fact it does take place and under certain circumstances at a rate appreciably faster than reaction (2). Thus a means can be provided to control both the particle size and shape (morphology) of the product by converting what is essentially a solid-solid reaction between $Al_2O_3$ and carbon into a gas-solid reaction between $Al_2O_2$, $N_2$ and C.

For titania, the reactions are as follows:

$$TiO_2 + C \rightarrow TiO \uparrow + CO \uparrow \qquad (1)$$

$$2\ TiO + N_2 + 2C \rightarrow 2\ TiN + 2\ CO \uparrow \qquad (2)$$

The conditions necessary for increasing the rate of reaction (1) over that of reaction (2) are:

(a) The reactivity of the carbon produced from the specific precursor (i.e. the polymer defined above). The inventors have discovered that carbon produced from a polymer of this kind, such as polyacrylonitrile (PAN), is extremely reactive and can increase the rate of reaction (1) considerably over that of reaction (2).

(b) The temperature of the reaction. Within the range of 1600°–1850° C. (for AlN) the rate of reaction (1) increases rapidly and thus larger particle sizes can be obtained by conducting the reaction at high temperature.

(c) The dispersion of the oxide in the polymer. This is critical to obtain a high rate for reaction (1) (due to increased contact between the oxide and carbon) and thus a uniform dispersion of the oxide in the polymer (carbon precursor) is important.

A further important feature of the present invention requires that the dispersion of the metal oxide in the polymer be formed into shapes in which substantially none of the oxide particles is more than about 2.5 mm from an external surface (i.e. a surface of the shape which is in free contact with the reactive $N_2$). In general, this means that the thickness of the shapes, at least in one dimension, should be no greater than about 5 mm. The shapes can be large irregular or spherical particles, thin elongated cylinders (referred to hereinafter as "noodles" because of their resemblance to pasta noodles used in cooking), and the like. Advantageously, the shapes are such that they naturally pack together quite loosely for the reasons explained later, so films, cubes, fine powders etc. should preferably be avoided. The formed shapes are then loosely packed in a reactor before the carbonization and the nitride-forming reactions take place.

As stated before, AlN and TiN are formed from their respective oxides, $Al_2O_3$ and $TiO_2$, via gaseous intermediate products, referred to hereinafter as volatile sub-oxides, namely $Al_2O_2$ and TiO. The volatile sub-oxides have to come into contact with nitrogen at the reaction temperatures to form the desired nitrides. However, this presents a dilemma. If the volatile sub-oxides can diffuse freely from the carbonized dispersion, the product yield will be low. On the other hand, if the volatile sub-oxides are trapped deep within the carbonized dispersion, the nitrogen will not have very good access to them and an impure product (generally containing unconverted metal oxides) will be formed. This problem is solved in the present invention by forming a carbonized dispersion having a dense structure which limits the escape of the volatile sub-oxides, as well as providing means to control the particle shape as explained later, but forming the dispersion into shapes which limit the maximum distance of penetration of the nitrogen into the dispersion to about 2.5 mm. By loosely packing such shapes into a reactor, nitrogen can pass freely through the voids between the shapes and similarly can penetrate the shapes to contact the sub-oxides. Ideally, the reactor packed with the shapes should have at least 40% of its volume in the form of voids between the packed shapes to allow easy access of nitrogen to the innermost packed shapes. Preferably, the shapes are such that they cannot easily be packed to a high density, i.e. a density in which less than 40% of the volume of the packed mass comprises voids.

In the above system, the carbonized shapes form "microreactors" which trap the volatile sub-oxides and permit a control of particle shape while permitting diffusion of nitrogen to the vicinity of all of the metal oxide particles.

Several other features of the invention are important for the formation of a pure nitride product as explained below.

Firstly, it is important to use a microfine oxide powder as the starting material so that the oxide has a large surface to volume ratio and consequently a large oxide to carbon interface when the nitride-producing reaction takes place. This accelerates the kinetics of formation of the volatile sub-oxide. The oxide should of course be as pure as possible. Relatively pure, microfine $Al_2O_3$ and $TiO_2$ powders are commercially available (e.g. from Degussa, Alcan, Alcoa, etc.) and can be used in the present invention.

Because the oxides employed in the present invention are ones which form gaseous intermediate products during their conversion to nitrides, the oxides may react virtually stoichiometrically with the carbon and ultimately the nitrogen because fresh layers of oxide are exposed as the surface layers react. Moreover, because there is a gaseous intermediate product, the final nitride particles do not necessarily correspond in size and shape to the original oxide particles, and thus it is possible to form whiskers, if desired, from non-whisker shaped oxide particles, as will be explained more fully later.

The polymer employed in the process is preferably one which has an affinity for the oxide. This means a polymer which is attracted to the oxide surfaces when the polymer is in solution or in the molten state. Another way of expressing this is to say that the electrokinetic potential ($\zeta$) of the polymer/oxide interface should be high. When this is the case, the polymer tends to coat the oxide particles and this effect may be greater than the Van der Waals forces which tend to attract oxide particles to each other and thus make them agglomerate. The polymer should have a molecular weight of at least 10,000 (preferably at least 50,000 and more usually at least 100,000), and a long chain structure of at least 200 monomer units. When solutions or melts of such polymers are formed, the microfine oxide particles can be dispersed in the solutions or melts by vigorous stirring to form stable suspensions in which the particles are separated from each other by surrounding polymer solution. The long-chain structure of the polymer is believed to hold the particles in suspension by virtue of the entanglement of the polymer chains with the particles. The oxide particles consequently have little or no tendency to agglomerate and they react individually with the carbon during the later nitride-formation step.

A surfactant may optionally be added to the polymer solution or melt to help keep the oxide particles separate and in suspension for long periods of time, but this is not usually required. Small quantities of a base, such as $Na_2O$, e.g. as present as impurities in alumina, help to gel the suspension and thereby prevent agglomeration and settling tendencies completely. It has been found that agglomeration of the oxide particles is to be avoided because this results in incomplete reaction during the nitride-formation step. Instead of reacting with carbon and nitrogen, agglomerated particles may fuse together, trapping carbon and impurities therein.

The polymer should also desirably be capable of generating a carbon structure of optimum porosity upon being carbonized. The porosity should be quite low to limit the loss of the volatile sub-oxide when the nitride-forming reaction is carried out because the sub-oxide cannot then easily escape before further reaction takes place. At the same time, the diffusion in of $N_2$ has to be permitted and escape of CO must be provided to allow for complete conversion of the oxide to the nitride.

The polymer must also have a chemical structure which is infusible or which is capable of being rendered infusible by additional steps, e.g. cyclisation and/or cross-linking, etc. carried out prior to the carbonization treatment. The infusible structure ensures that the gases generated during carbonization evolve from a solid rather than a liquid so that the uniform distribution of oxide particles is not disturbed.

The polymer should have a high carbon yield of at least 30% by weight (and preferably at least 40% by weight) when subjected to carbonization. This ensures that each oxide particle is surrounded by sufficient carbon, i.e. at least the stoichiometrical amount, to permit substantially complete conversion to the sub-oxide (which is in turn converted to the nitride). The carbon formed from the polymer should also have high reactivity so that the formation of the volatile sub-oxide is accelerated.

When the dispersion is to be formed by the use of a polymer solution, the polymer starting material should preferably be readily soluble in a solvent and should preferably be capable of producing a solution which (after the addition of the oxide and optional additional ingredients) has a viscosity in the range of 200-5000 cp at 25° C., and preferably 500-1500 cp at 25° C. A solution of this viscosity can easily be handled.

Suitable polymer materials for use in the present invention include polyacrylonitrile and its copolymers and terpolymers (collectively referred to hereinafter as PAN), cellulose and its derivatives (e.g. cellulose acetate and the material sold under the trade mark RAYON), polyvinyl alcohol and its copolymers and terpolymers (referred to hereinafter as PVA), polyarylether, polyacenaphthylene, polyacetylene, and the like. Additional suitable materials are also disclosed in "Precursors for Carbon and Graphite Fibers" by Daniel J. O'Niel, Item. J. Polymeric Mater. Vol. 7, (1979) p. 203.

PAN is a known polymer having a high carbon yield of about 55% by weight widely used for textiles such as ORLON (trademark) manufactured by E. I. DuPont de Nemours and Company (the structure of this particuilar product is discussed in an article by R. C. Houtz, Textile Research Journal, 1950, p. 786). Textile grade PAN is commonly a copolymer of acrylonitrile and up to 25% by weight (more commonly up to 10% by weight and usually about 6% by weight) of methyl acrylate or methyl methacrylate. Textile grade PAN copolymers can be used in the present invention and are in fact preferred to PAN homopolymer because the additional units in the copolymer assist in the cyclization of the polymer when heated in air at about 200° C. for several hours, a step known as heat stabilization. Inexpensive waste PAN from the textile industry, such as the so-called "dryer fines" produced by textile companies, may be employed in the present invention.

One way of forming the uniform dispersion of the oxide in the polymer is to mix the particles thoroughly with a polymer melt, followed by allowing the melt to cool. Polymers having relatively low viscosities in the molten state should be chosen and, if necessary, plasticisers may be added to the polymer melt in order to make it more fluid and thus to permit the oxide particles to be uniformly distributed.

When the polymer/oxide intermediate product is formed by dispersing the microfine oxide particles in a polymer melt, high torque mixing equipment may be required because of the high viscosities normally encountered. If the dispersion step is carried out for a suitable length of time, an homogenous distribution of the oxide particles can be achieved. The molten dispersion can then be shaped as desired and allowed to cool.

However, the preferred way of forming the uniform dispersion of the oxide particles in the polymer is to form a solution of the polymer in a solvent, introduce the oxide particles into the solution, agitate the solution to disperse the particles uniformly, and then remove the solvent from the solution. The solvent employed preferably has a lower affinity for the oxide than the polymer does. The solvent can be removed by solvent extraction (also known as "liquid drying") which involves introducing the polymer solution into a bath of a liquid non-solvent for the polymer, the non-solvent being miscible with the solvent. This causes the polymer to precipitate or coagulate rapidly and without disturbing the dispersion of the oxide particles and allows the oxide/polymer dispersion to be formed with suitable shapes. The resulting product is a solidified polymer containing a uniform dispersion of oxide particles held separate from each other by encircling layers of polymer. The solvent extraction method also lends itself ideally to the formation of a hollow product, when desired, and to the control of void size, as will be explained later. In view of this, when choosing a polymer for the preferred process, an important consideration is the availability of a suitable non-solvent. It is advantageous, for example, to choose a solvent and non-solvent which are easily separable from each other (e.g. by distillation) so that one or both may be re-used. The non-solvent is also preferably one which is non-wetting with regard to the polymer solution.

When PAN is used as the polymer, suitable solvents are dimethylformamide (DMF) dimethylsulfoxide (DMSO) and dimethylacetamide (DMAc). DMF is the preferred solvent and solutions of the required viscosity can be made by dissolving a sufficient amount of PAN in DMF to give a solution containing 5-20% by weight, more preferably 8-16% by weight and most preferably 8-12% by weight of PAN.

When the polymer is cellulose or a cellulose derivative, a suitable solvent is DMF containing about 10% by weight of $LiCl_2$. A suitable solvent for PVA is DMF.

When the solution contains cellulose in $LiCl_2$-DMF, the non-solvent may be water or a water-DMF mixture.

When the solution contains PVA in DMF, the non-solvent may be acetone or methyl ethyl ketone. When the solution contains PAN in DMF, the non-solvent may be water or methanol. Suitability as a non-solvent for the PAN/DMF system appears to be associated with a high polarity and the presence of -OH groups. Acetone, for example, is not suitable as a non-solvent. Since water is inexpensive, it is the preferred non-solvent, but is advantageously mixed with the solvent itself, e.g. DMF, for the following reason. If the non-solvent alone is used in the bath, the solvent extracted from the droplets causes the solvent concentration in the bath to change rapidly, and this markedly affects the conditions under which the coagulation or precipitation of the polymer take place. When the bath already contains a large amount of solvent, the solvent concentration in the bath changes less rapidly as the process proceeds. Accordingly the bath advantageously contains 25% by weight or more of the solvent when the process is commenced. When the polymer is PAN and the solvent is DMF, the bath preferably contains 0–80% by weight of DMF in water, more preferably 25–60% by weight and normally about 40% by weight. If desired, the amount of solvent in the bath can be kept constant by continuously adding a suitable amount of the non-solvent.

In more detail, the polymer is first dissolved in the solvent to form a solution of the desired viscosity. The amount of polymer dissolved in the solvent determines the amount of oxide that can be subsequently added, but if too much polymer is dissolved, the viscosity of the solution may become too high for easy processing.

The microfine oxide particles are then suspended in the polymer solution. This is preferably done with vigorous stirring in order to break up any lumps of oxide particles and thus to ensure that complete separation of the particles takes place. Mechanical stirring or agitation is advisable, e.g. by using a common blender or an ultrasonic dispersion technique.

The amount of oxide added to the solution should preferably be such that, upon later conversion of the polymer to carbon, the ratio of carbon to oxide is slightly in excess of the stoichiometrical ratio for the reaction (e.g. 0–1% by weight excess carbon, but more usually 5 to 10% by weight excess carbon). For example, when the oxide is $TiO_2$, the ratio of oxide to polymer is preferably 8:4.8 by weight. When the oxide is $Al_2O_3$, the ratio is preferably 10:7 by weight.

A heat-decomposible blowing agent may optionally be incorporated into the polymer solution before the solution is contacted with the non-solvent bath. The blowing agent is preferably a finely divided solid which is insoluble in the polymer solution. As with the oxide particles, the long chain structure of the polymer holds the particles of blowing agent in uniform suspension in the solution.

Suitable solid blowing agents include $(NH_4)_2CO_3$, $NH_4HCO_3$ and ammonium carbamate. Preferably, the solid blowing agent is used in the form of fine particles of less than 100 Tyler mesh in size. However, the actual size of the particles is less important than the requirement that they be uniformly distributed so that equal quantities of gas are generated from all parts of the solution.

As well as the blowing agent, additional materials may be suspended or dissolved in the polymer solution, if desired. For example, tar or pitch may be incorporated into the polymer solution. This can be beneficial because tar and pitch are inexpensive and can partially replace the polymer. The tar or pitch may be incorporated in amounts of up to one part by weight per part by weight of the polymer.

When a heat-decomposible blowing agent is incorporated into the polymer solution, and when the temperature of the non-solvent bath exceeds the decomposition temperature of the blowing agent, gases are generated within the polymer solution simultaneously with the rapid coagulation or precipitation of the polymer, and a hollow product is formed instead of the solid product formed in the absence of a blowing agent. The advantages of forming a hollow product are described later.

The introduction of the polymer solution containing the oxide into the non-solvent bath can be carried out by any suitable method, e.g. by dividing the solution into droplets and allowing the droplets to fall into the bath or by extruding a constant stream of the solution into the bath below its surface. The former method results in the formation of small spheres of coagulated or precipitated polymer containing the oxide and the latter method results in the formation of continuous noodles, strands or sheets of the polymer containing the oxide. The product, in whatever form, may be solid or hollow depending upon whether or not a blowing agent is employed. As noted above, the solid or hollow product should be in the form of shapes having a maximum thickness of about 5 mm in at least one dimension.

After the polymer/oxide intermediate shaped product has been formed in the non-solvent bath it is removed and dried under gentle heating, e.g. at about 100° C. in air or at a lower temperature in a vacuum.

The polymer/oxide intermediate product can then be subjected directly to the carbonization and nitride-forming steps if the polymer already has an infusible structure. However, the polymer may first require cross-linking or cyclization to make it infusible. Cellulose can be subjected directly to the carbonization treatment and so can PAN, but PAN may be subjected to a "heat stabilization" step in which the structure cyclizes, e.g. as follows:

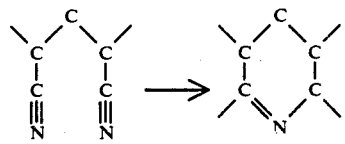

and consequently becomes infusible. This heat stabilization step, which is carried out by heating the polymer/oxide intermediate product in air at a temperature of about 200°–220° C. for several hours (usually 8–16 hours), also increases the oxygen content of the polymer. Alternatively, the polymer may be heated slowly in an $N_2$ atmosphere which helps to cyclise the polymer without oxygen absorption. The stabilization period may be reduced, if desired, by incorporating an antioxidant into the polymer solution prior to its coagulation or precipitation or at a later stage and then increasing the temperature in the stabilization treatment.

The carbonization and nitride-formation steps are then carried out on the heat-infusible polymer/oxide intermediate product in the form of shapes which are loosely packed together.

Once the carbonization vessel has been loosely filled, the intermediate product is raised to carbonization temperatures (500°–700° C.) in a non-oxidizing atmosphere (e.g. nitrogen or argon) in order to convert the polymer to carbon. Indeed, the carbonization step may be carried out as the temperature of the intermediate product is raised to the nitride-forming range because carbonization takes place quite rapidly. For example, if the temperature of the intermediate product is gradually raised to the nitride-forming range over a period of about 30 minutes, carbonization of the polymer is complete before the nitride starts to form.

The nitride-formation step is carried out following the carbonizing step, or as already noted, as part of a single combined step in the same reaction vessel. The nitride formation step involves heating the carbon/oxide composite to high temperature (usually about 1,300° C. to 2,000° C.) in an atmosphere containing nitrogen for several hours (e.g. up to 12 hours). The nitrogen-containing atmosphere can be pure nitrogen, nitrogen mixed with a non-oxidizing gas, or an atmosphere of a compound which generates nitrogen in the reaction conditions, e.g. ammonia or an amine such as methylamine. The actual temperature employed and other reaction conditions depend on the identity of the oxide employed as the starting material and on other factors as explained below.

We have found that the presence of large internal voids in the carbon/oxide composite (i.e. voids having a size greater than about 100 $\mu$) permits nitride whiskers to grow. Composites with smaller internal voids (i.e. less than about 70 $\mu$, and particularly less than about 50 $\mu$) favour the formation of nitride powder. For this reason the use of a solid polymer/oxide intermediate product is selected when powder is desired. After carbonization of the solid product, the carbon/oxide composite has fine porosity. On the other hand, the large internal voids of the hollow product allow whiskers to grow in the void spaces. However, as well as a large internal void, the composite resulting from the hollow product contains small voids in its walls and small particles tend to form in such voids. Accordingly, the wall thickness should be kept as thin as possible by suitably adjusting the ratio of the polymer and blowing agent in the starting solution. A relatively large amount of the blowing agent greatly inflates the polymer and thus produces thinner walls.

In general, the process of the present invention is more likely to form nitride whiskers than powders when the following conditions apply:

a) the oxide-containing polymer body is hollow rather than solid;

b) the ratio of oxide to carbon is substantially stoichiometrical; and c) a non-stabilized (although infusible) polymer is employed for the carbonization and nitride-forming steps.

On the other hand, the process of the present invention is more likely to form nitride powder than whiskers when the following conditions apply:

a) the oxide-containing polymer body is formed as a solid dense body;

b) a stabilized polymer is employed for the carbonization and nitride-forming reaction; and c) a slight excess of carbon over the oxide is employed, although it is possible to use carbon at a ratio less than stoichiometric.

It is another notable characteristic of the present invention that the particle size of the product is not dependent upon the size of the oxide used as the starting material because the oxide is converted to a gaseous intermediate product. Moreover, steps can be taken to control the size of the nitride particles because it has been noted that the size of the product particles increases with increases in the reaction temperature. However, when lower temperatures are used in order to produce smaller particles, it is found that the reaction does not go to completion due to a slower rate of reaction. This problem can be overcome by employing a reaction having two or more steps carried out at different temperatures. A lower temperature can be used until the reaction is substantially complete and then the temperature can be raised in order to drive the reaction to completion. If larger particles are formed at the higher temperature, they form an insignificant proportion of the total. A sintered product can also be produced if the final temperature is within the sintering range of the nitride being formed.

When whiskers are being produced rather than powders, the same two stage procedure can be carried out to control the aspect ratio (1/d) of the whiskers.

The actual values of the lower temperature and the higher temperature depend on the nitride being formed, but can easily be obtained by simple experimentation.

The nitride-forming reaction may be carried out at atmospheric pressure or at higher pressures. A graphite reaction vessel is normally employed for the reaction, although this is not essential. The product may be a composite of nitride particles in a carbon matrix containing very little or no unreacted oxide but the excess carbon may be avoided or minimized by using stoichiometric or near stoichiometric quantities of the reactants. The nitride particles are substantially unagglomerated and can be easily separated. Gentle crushing may be required to form a powder, but this is quite different from the grinding steps necessary with conventional nitride-formation methods.

When $Al_2O_3$ is used as the starting material for the production of AlN, the nitride-forming reaction is normally carried out at a temperature above 1600° C. By controlling the reaction temperature, the rate of generation of $Al_2O_2$ can be controlled. In addition, when the carbon matrix is dense, the rate of diffusion of the $Al_2O_2$ is limited and thus the grain size can be controlled by control of the temperature.

At 1750° C. it is possible to produce homogeneous crystals of AlN of about 0.4-0.5 $\mu$ in size. At about 1850° C. the crystals grow to about 25 $\mu$ in size.

In a preferred form, the invention can provide an AlN product having novel characteristics. AlN is generally highly hygroscopic which makes it unsuitable for many purposes. It has been reported that AlN of large particle size can be made non-hygroscopic, but until now it was not possible to produce AlN powder or whiskers of less than 1 $\mu$ in size that were also non-hygroscopic. This is now possible by means of the present invention. It is believed that the formation of the nitride via the suboxide somehow makes the product non-hydroscopic. This differs from the grain growth phenomenon observed in other processes.

When $TiO_2$ is used as the starting material for the formation of TiN, the nitride-forming reaction may be carried out at temperatures above 1350° C. The reaction goes to completion at temperatures of about 1550° C. in about 4 hours. The TiN produced at this temperature has a primary particle size of about 10-20 $\mu$ and appears sintered. At lower temperatures, e.g. about 1450° C., the TiN produced is submicronic but the reaction proceeds slowly and conversion is not complete even after about 5½ hours. The reaction may accordingly be carried out at a temperature of say 1400° C. for several hours and then the temperature may be increased to 1550° C. for a short time to complete the reaction, this produces TiN in an unsintered microfine particulate state.

In the case of AlN, any excess carbon can be removed from the nitride/carbon product by oxidation of the carbon to carbon monoxide or carbon dioxide. This may be carried out by heating the composite in air at a temperature of about 500°-800° C. for several hours (e.g. about 2-10 hours). The carbon is quite easy to remove because it coats the nitride particles rather than being trapped within agglomerated lumps of the nitride product. This is not possible for TiN, however, because the nitride is itself oxidizable. It is therefore desirable in this case to use ratios of oxide to carbon which are less than stoichiometric and avoid altogether excess carbon. At the same time, no excess oxide is left behind as it is lost as the volatile sub-oxide. This is a particular advantage when the final product is oxidizable (i.e. TiN). This is only feasible because the volatile suboxide is formed at a rate faster than the nitride.

The invention is illustrated further by the following Examples and Comparative Examples and reference is made to the accompanying drawings, in which:

Figure 1:
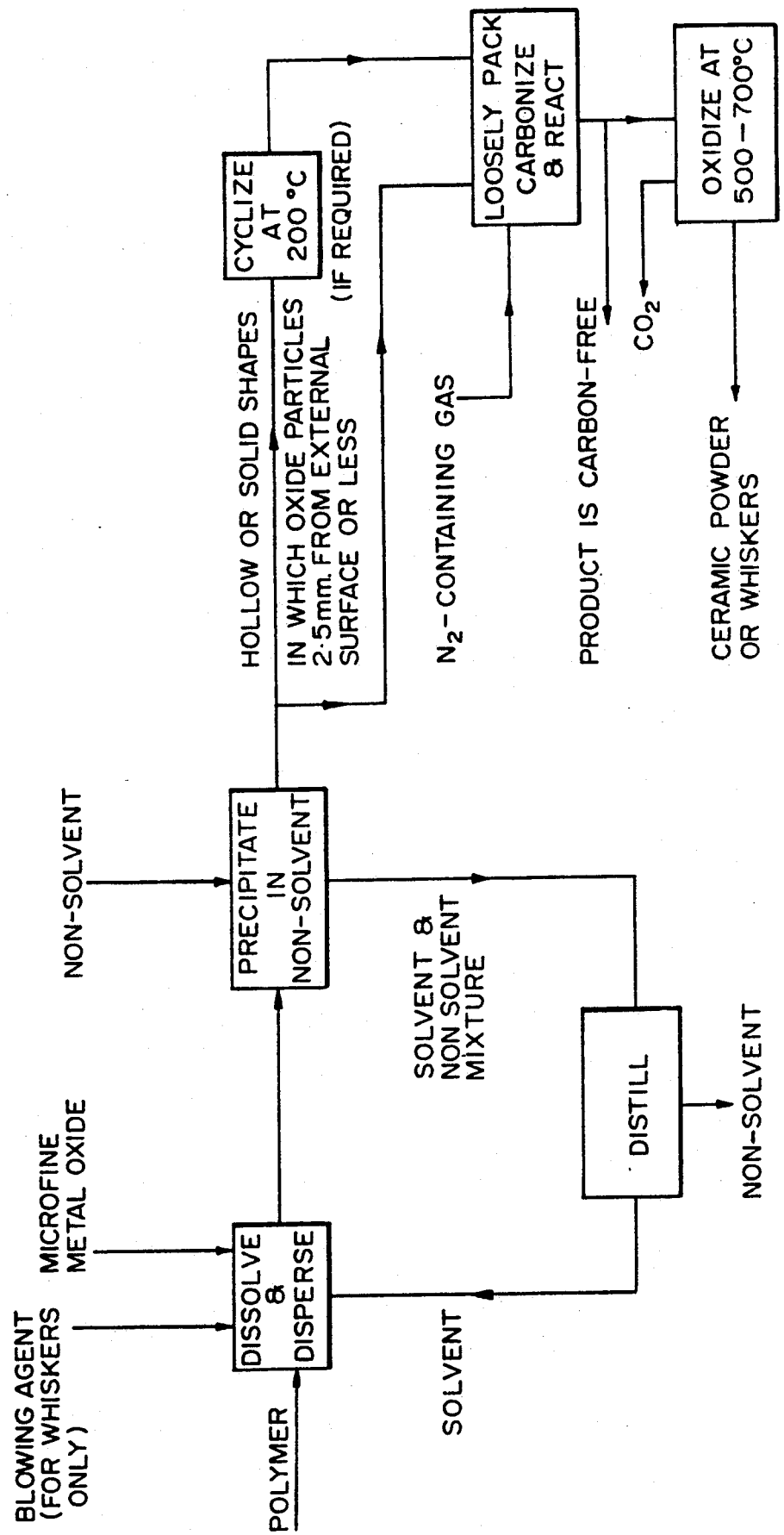
FIG. 1 is a schematic drawing illustrating the steps carried out in the preferred form of the invention used in the Examples.

Briefly referring to FIG. 1, the "solvent-drying" technique of forming the dispersion of oxide particles in the polymer is disclosed. Since all of the steps are explained in the drawing itself, further detailed description here is believed to be unnecessary.

EXAMPLE 1

Figure 2:
FIGS. 2 to 10 are scanning electron micrographs of nitride products produced in the Examples.

Microfine $TiO_2$ was dispersed in a 12% solution of PAN in DMF. The ratio of $TiO_2$ to PAN was maintained at 8:4.4. The suspension was extruded through an orifice and precipitated in a DMF-water mixture (40:60) at room temperature to produce noodle shapes of 5 mm diameter containing $TiO_2$ dispersed in PAN. These noodles were loosely packed in an induction furnace and reacted at 1550° C. in a nitrogen atmosphere for 3 hours. The product was golden yellow in colour indicating that there was no excess carbon. X-ray diffraction (XRD) analysis revealed the presence of titanium nitride alone. No impurity was detected. FIG. 2 is a scanning electron micrograph (SEM) of the product showing significant sintering.

EXAMPLE 2

Figure 3:
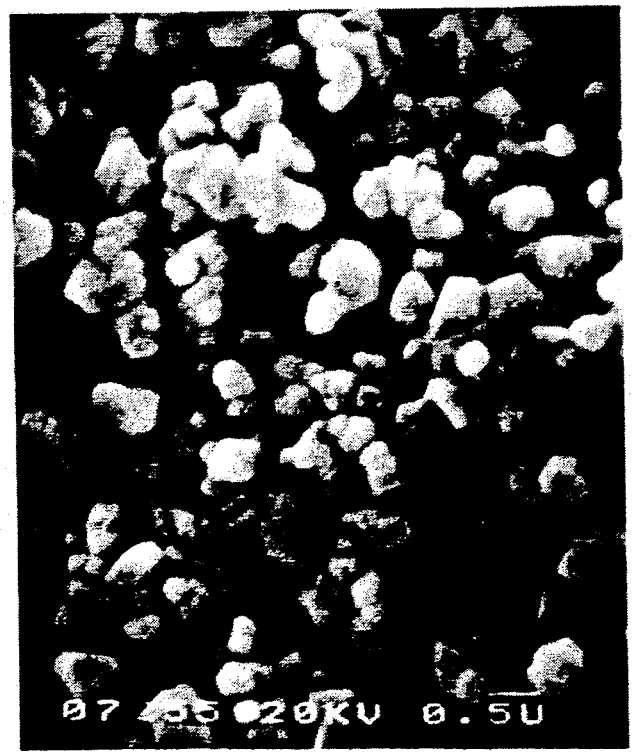

The $TiO_2$-PAN noodles produced as in Example 1 were stabilized in air at 210° C. for 18 hours, and were then loosely packed and reacted at 1450° C. for 5½ hours in an $N_2$ environment. XRD of the product showed the presence of a major portion of TiN and a minor portion of $TiO_2$. The particles had an average particle size of 0.5-0.6 $\mu$m and, as shown in FIG. 3, were not sintered.

EXAMPLE 3

Figure 4:
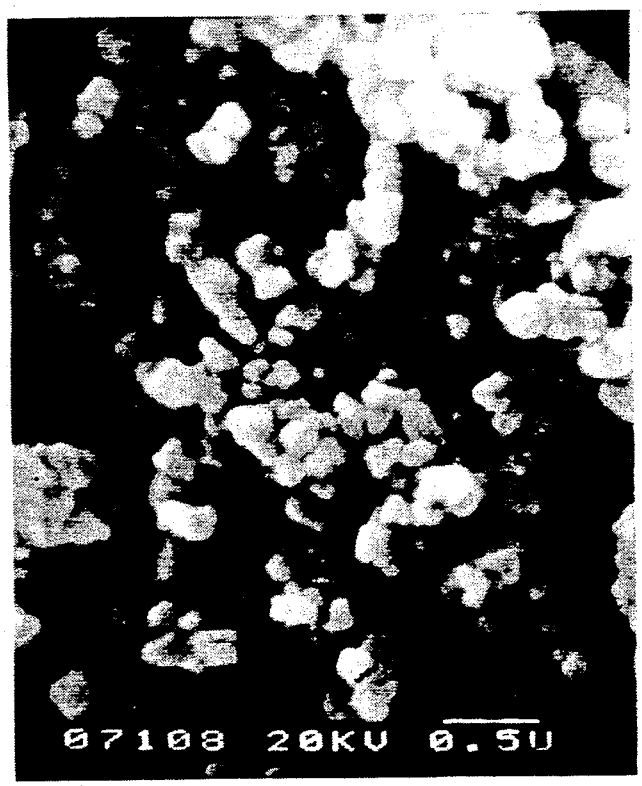
Figure 5:
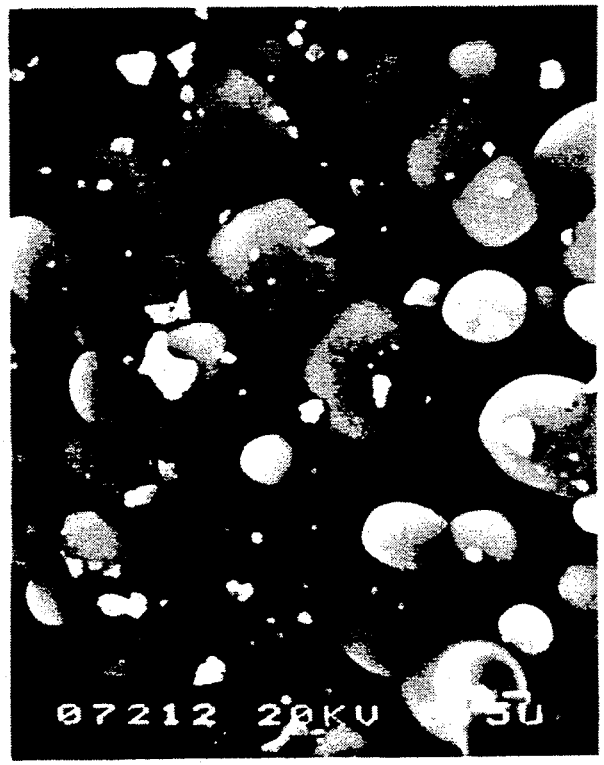
Figure 6:

The stabilized, loosely packed $TiO_2$-PAN noodles as in Example 2 were heated to 1400° C. for 7 hours in $N_2$. The TiN particles were 0.1-0.2 $\mu$m in size and, as shown in FIG. 4, were not sintered. The particles were heated further to 1550° C. for 2 hours to complete the reaction. An increase in particle size to 1-2 $\mu$, was observed (FIG. 5). A half hour residence time at 1550° C. gave TiN particles which were 0.5-1 $\mu$m in size and were loosely agglomerated (FIG. 6).

EXAMPLE 4

Three experiments were conducted. Alumina fines from Degussa and PAN copolymer from DuPont were used as the basic raw materials. In the first two tests PAN was dissolved in DMF to form a 6% solution of PAN in DMF and $Al_2O_3$ was dispersed in it with a blender to obtain a ratio of $Al_2O_3$ to PAN of 10:7. Ammonium bicarbonate (2%) was added to the solution to produce hollow spheres of 5 mm diameter upon precipitation of the solution in a water bath maintained at 60° C. The spheres were stabilized at 210° C. for 16 hours, loosely packed together in a reactor and reacted at 1550° C. for 2.5 hours in Test 1 and at 1850° C. for four hours in Test 2. In Test 3, starting with a 10% solution of PAN in DMF, $Al_2O_3$ was added to obtain a 1:1 ratio of $Al_2O_3$:PAN. Noodle shapes of 5 mm diameter were precipitated in a DMF/water bath. The noodles were stabilized at 210° C. for 16 hours and loosely packed together. The nitride-forming reaction was then conducted at 1700° C. for 2 hours. The results were as follows:

| | |
|---|---|
| Test 1: 1550° C. | Little conversion of $Al_2O_3$ to AlN. Major component in product $\alpha$-$Al_2O_3$. Minor component in product AlN. Excess carbon could be oxidized easily. |
| Test 2: 1850° C. | Complete conversion of $Al_2O_3$ to AlN. XRD analysis indicated presence of AlN only. Some excess carbon present. Oxidation difficult. |
| Test 3: 1700° C. | Complete conversion of $Al_2O_3$ to AlN. XRD analysis indicates presence of AlN. Excess carbon could easily be oxidized at 700° C. |

The difficulty in oxidation of carbon was due to incipient sintering of AlN. However, in the material produced at 1700° C., carbon could be oxidized since AlN particles were not sintered.

At 1700° C. the AlN grains were about 0.3 to 0.5$\mu$ in size. They grew to about 25$\mu$ by 1850° C. These results indicate that at temperatures between 1700° C. and 1800° C., AlN grains of $<1\mu$ in size could be produced. Under these conditions it is believed that excess carbon could be eliminated with comparative ease.

Figure 7:

Whiskers of AlN were observed in the hollow spaces (FIG. 7) at 1850° C.

Figure 8:
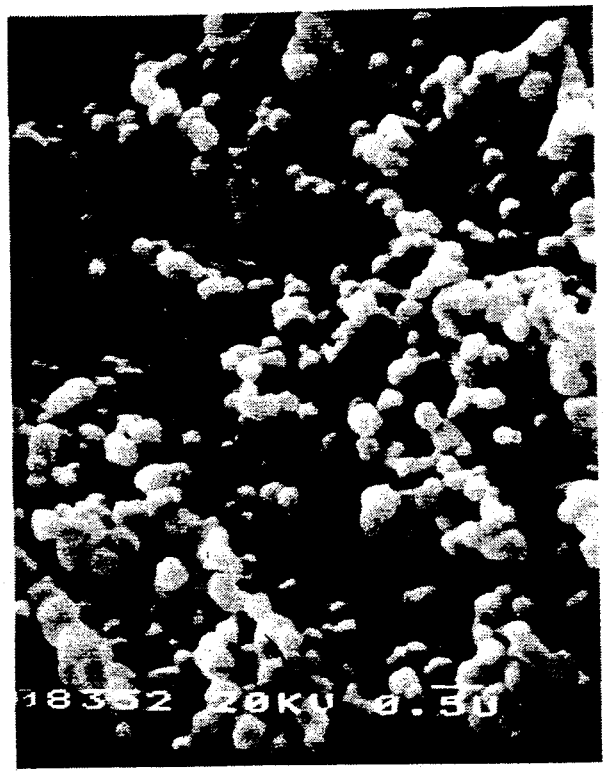
Figure 9:

SEM photographs of the materials produced at 1700° C. and 1850° C. are shown in FIGS. 8 and 9, respectively.

EXAMPLE 5

10% solution of PAN in DMF was prepared and ground bayer alumina (particle size $<1$ $\mu$) was dispersed to having 2-3 mm diameter were prepared by extruding the above suspension into a DMF/$H_2O$ bath of 40:60 ratio maintained at room temperature.

Figure 10:
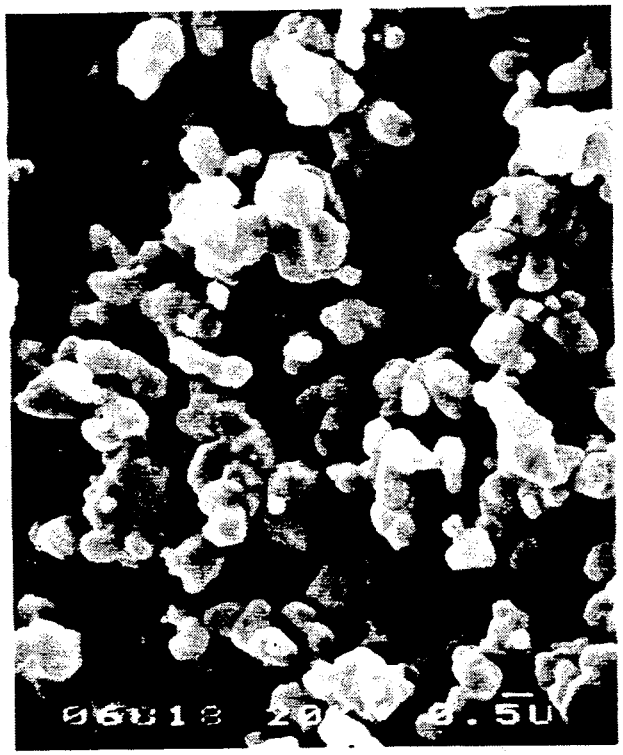
Figure 11:
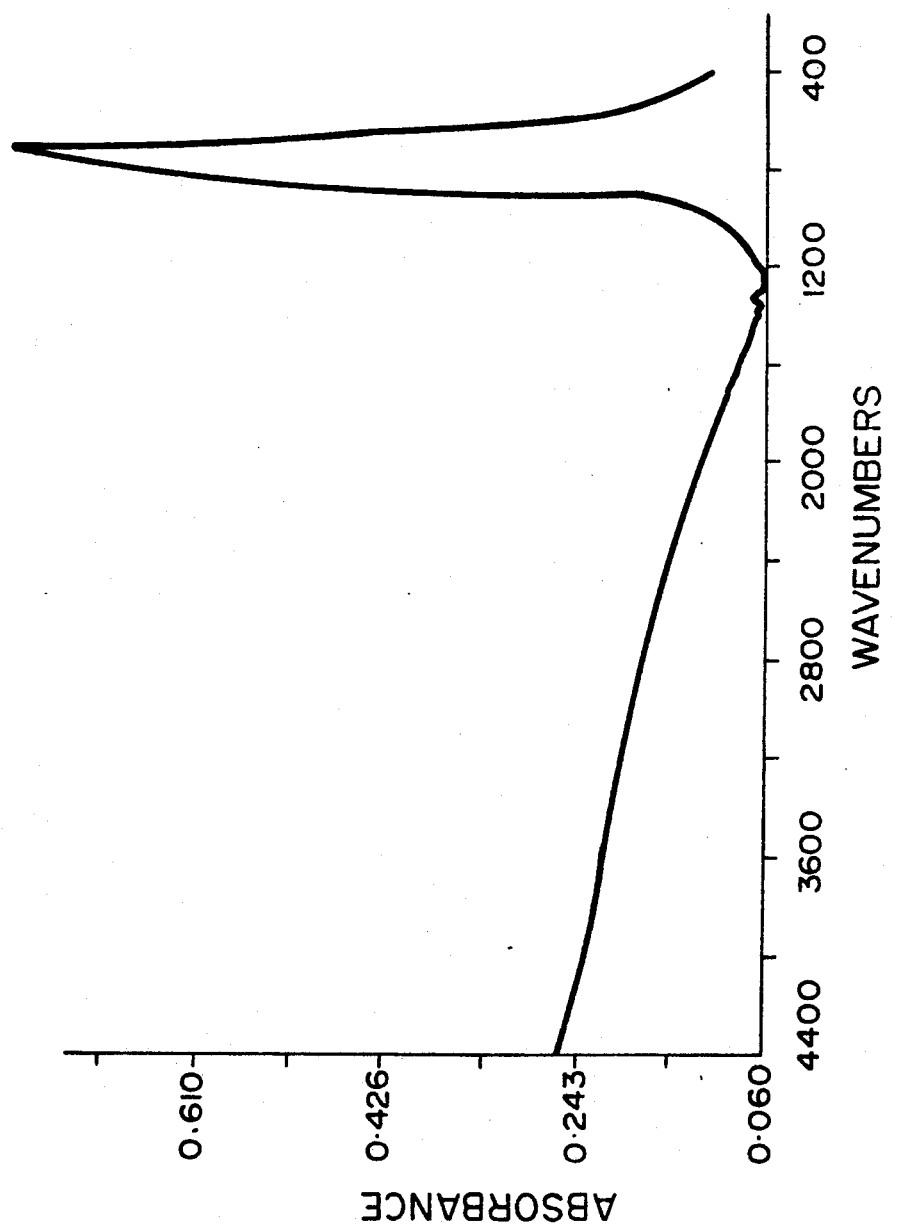
FIG. 11 is an infrared spectrum of the product of Example 5.

The noodles were dried at 100° C., heat stabilized at 210° C. for 16 hours in air and loosely packed in a graphite 0 crucible. The noodles were then heated to 1700° C. in $N_2$ atmosphere to convert the $Al_2O_3$ to AlN. The reaction time was 2 hours. The product was oxidised at 650° C. to remove excess carbon. The AlN particles were <1 μ in size (FIG. 10) and XRD analysis did not indicate any $Al_2O_3$. The Infrared spectrum of the product as shown in FIG. 11 does not show the presence of $H_2O$ or $Al_2O_3$.

Comparative Example 1 and Example 6

As a Comparative Example, about 1.4 kg of noodle shapes were produced as described in Example 5, except that the source of the $Al_2O_3$ was from Degussa. The noodles were crushed to below 35 Tyler mesh after stabilization. The reaction was conducted at 1750° C. for three hours in a graphite crucible under an $N_2$ atmosphere.

A small portion of the product, when analysed by XRD after oxidation, showed the presence of substantial quantities of unreacted $Al_2O_3$. The balance was reacted again at the same temperature for an additional 8 hours and the product, when analyzed by XRD, still showed the presence of significant quantities of α alumina. It is believed that the crushing of the noodles resulted in dense packing thus preventing diffusion of sufficient $N_2$ for complete conversion.

The experiment was repeated except that the noodles were not crushed but packed as such in the graphite crucible. Only 800 gm of the material could be accomodated. After the reaction at 1750° C. and oxidation at 700° C. the product showed only AlN and no unconverted $Al_2O_3$ by XRD. The size of AlN particles was 0.4–0.5 μ as seen by SEM. The oxygen content of the exposed sample as determined by neutron-activation was less than 1%.

This product was left in air (50 % humidity) for 48 hours. The weight increase was 0.2% and showed no tendency to increase after the first 24 hours. This indicates that the product is highly non-hygroscopic.

What we claim is:

1. A process for producing a nitride of a metal selected from the group consisting of aluminum and titanium in the form of fine particles selected from the group consisting of powder and whiskers by reaction of the corresponding metal oxide with carbon at high temperature in the presence of nitrogen, wherein the process comprises:

forming a uniform dispersion of microfine particles of said oxide in a polymer having the following characteristics: (a) a molecular weight of at least 10,000 and a long chain structure of at least 200 monomer units, (b) a carbon yield of at least 30% by weight, and (c) a chemical structure which is infusible or which is capable of being rendered infusible, said dispersion being formed by dissolving the polymer in a solvent, adding the oxide particles to the resulting solution, agitating the solution to disperse the particles uniformly, and removing the solvent by adding the solution to a bath containing a non-solvent for the polymer and the metal oxide which non-solvent is miscible with the solvent such that the polymer is coagulated and such that said particles are substantially unagglomerated and separated from each other by said polymer;

while removing said solvent, forming the dispersion into bodies shaped in such a way that substantially none of the oxide particles within any one of said bodies is more than about 2.5 mm from an external surface of said one body;

loosely packing said bodies into a reactor in such a way that at least 40% of the volume of the packed bodies comprises voids between the bodies;

carbonizing the resulting bodies in said reactor in non-oxidizing atmosphere in order to convert the polymer to carbon;

and heating the carbonized product in said reactor at high temperature in a non-oxidizing atmosphere containing nitrogen or a compound which decomposes to form nitrogen at said high temperature in order to form said nitride particles.

2. A process according to claim 1, wherein said dispersion is formed into bodies selected from the group consisting of irregular bodies, spherical particles and elongated cylinders.

3. A process according to claim 1, for producing said nitride predominantly in the form of a powder, wherein said dispersion is formed into bodies which, upon carbonization, contain substantially no internal voids larger than about 70 μ in diameter.

4. A process according to claim 1, for producing said nitride predominantly in the form of whiskers, wherein said dispersion is formed into bodies which, upon carbonization, contain internal voids larger than about 100 μ in diameter.

5. A process according to claim 1 wherein the metal oxide is $Al_2O_3$ and said carbonized product is heated in said non-oxidizing atmosphere containing nitrogen at a temperature in the range of about 1600° C. to about 1850° C.

6. A process according to claim 5 wherein the carbonized product is heated at a temperature of about 1600° C. to about 1750° C. until most of the oxide is converted to nitride and then the temperature is raised above 1750° C. but not higher than about 1850° C. until substantially no further oxide is converted to nitride.

7. A process according to claim 1 wherein the metal oxide is $TiO_2$ and said carbonized product is heated in said non-oxidizing atmosphere containing nitrogen at a temperature in the range of about 1350° C. to about 1550° C.

8. A process according to claim 7 wherein the carbonized product is heated at a temperature of about 1350° C. to about 1400° C. until most of the oxide is converted to nitride and then the temperature is raised above 1400° C. but not higher than about 1550° C. until substantially no further oxide is converted to nitride.

9. A process according to claim 1, wherein said bodies are carbonized by heating them to a temperature in the range of about 500°–700° C.

10. A process according to claim 1 wherein said polymer is selected from the group consisting of polyacrylonitrile and the copolymers and terpolymers thereof.

11. A process according to claim 1 wherein said bodies are formed into shapes selected from the group consisting of spheres and elongated noodles.

12. A process according to claim 1, wherein the oxide is converted to the nitride via an intermediate step of forming a volatile sub-oxide, the rate of formation of the sub-oxide being higher than the rate of conversion of the sub-oxide to the nitride.

* * * * *